United States Patent [19]

Hershel

[11] Patent Number: 4,808,807
[45] Date of Patent: Feb. 28, 1989

[54] OPTICAL FOCUS SENSOR SYSTEM

[75] Inventor: Ronald S. Hershel, Albany, Oreg.

[73] Assignee: General Signal Corp., Stamford, Conn.

[21] Appl. No.: 937,767

[22] Filed: Dec. 4, 1986

[51] Int. Cl.⁴ .............................................. G01J 1/20
[52] U.S. Cl. .................................. 250/201; 356/395
[58] Field of Search .................... 356/395, 4; 354/400, 354/402, 403, 404, 405, 406, 407, 408; 250/237 G, 201 PF, 201 AF, 204, 201 R

[56] References Cited

U.S. PATENT DOCUMENTS

| | | | |
|---|---|---|---|
| 2,881,686 | 4/1959 | Ruhle | 95/44 |
| 2,887,019 | 5/1959 | Dodin | 95/42 |
| 3,054,898 | 9/1962 | Westover | 250/83.3 |
| 3,274,913 | 9/1966 | Biederman | 95/44 |
| 3,482,107 | 12/1969 | Hock | 250/237 |
| 3,586,665 | 6/1971 | Weyrauch | 356/395 |
| 3,706,492 | 12/1972 | Roblin | 356/5 |
| 3,781,110 | 12/1973 | Leitz | 356/4 |
| 3,856,401 | 12/1974 | Heitmann et al. | 356/395 |
| 3,917,409 | 11/1975 | Kaestner | 356/395 |
| 4,037,958 | 7/1977 | Schmidt et al. | 356/4 |
| 4,195,909 | 4/1980 | Holle et al. | 356/395 |
| 4,222,633 | 9/1980 | Hock | 356/395 |

FOREIGN PATENT DOCUMENTS 1208505 10/1970 Fed. Rep. of Germany.
1249302 10/1971 United Kingdom.

Primary Examiner—David C. Nelms
Assistant Examiner—J. L. Ruoff
Attorney, Agent, or Firm—Flehr, Hohbach, Test, Albritton & Herbert

[57] ABSTRACT

An optical focus sensing system is disclosed. The system provides a focus shift measurement capability utilizing the relative motion between two gratings to produce different diffraction orders which are separately detected by a pair of detectors to form signals having a phase difference proportional to the focus error corresponding to the planes occupied by the two gratings. A control circuit is responsive to the phase difference between the signals from the two detectors to provide a controllable focusing capability.

4 Claims, 3 Drawing Sheets

FIG.—1

STAGE VELOCITY

OPTICAL FOCUS SENSOR SYSTEM

BACKGROUND OF THE INVENTION

The present invention relates to an optical focus sensor system.

Optical focusing techniques are, of course, well known in the prior art. In applications where focusing requirements are in the micron range, numerous parameters are involved, such as the stability of the optics or lens used in the system, the rigidity and stability of the lens support and the object and image planes, temperature and vibration, among others. Any of the above parameters can dramatically affect the proper focusing of the system.

Some prior art approaches in automatic focusing systems have included some form of arrangement in which the amplitude of a signal corresponding to the proximity of best focus of an image (such as an image of a semiconductor reticle) is utilized for focusing techniques. As an example, such an approach is described in U.S. Pat. No. 3,781,110. Such prior art approaches in general depend upon an object having some spatial frequency components equal to that of a grating in an image plane. While prior art approaches can provide an indication of the proper location of a desired focal plane, there is no capability of indicating with a single measurement how far and in what direction the proper or desired focal plane is located.

SUMMARY OF THE INVENTION

In view of the foregoing, it is an object of the present invention to provide an improved optical focus sensor system.

Briefly, the optical focus sensor system according to the present invention provides an automatic focusing capability. The system includes a first grating means for diffracting a light beam representative of an object (such as a reticle) into a plurality of diffracted light beams where each of the diffracted light beams has a respective interference order.

The system also includes second grating means and projection optic means for focusing the diffracted beams having the respective interference orders to the second grating means. The system also includes means for moving one grating with respect to the other in a direction parallel to the grating surface and normal to the grating lines.

Since only the zero and ±1 orders are desired on the second grating, both gratings may consist of approximately equal opaque and clear lines on a substrate with a period such that the ±1 orders fall within the numerical aperture at the lens.

The system further includes means for producing first and second control signals corresponding to the +1 and −1 orders after the light has passed through the second grating and where a phase difference between the first and second control signals is proportional to the focus error. The system further includes control means responsive to the phase difference between the first and second control signals for adjusting the position of one of the conjugate focal planes, thereby providing a controllable focusing capability.

Other objects, features and advantages of the present invention will become apparent from the following detailed description when taken in conjunction with the accompanying drawings.

DETAILED DESCRIPTION OF THE DRAWINGS

Figure 1:
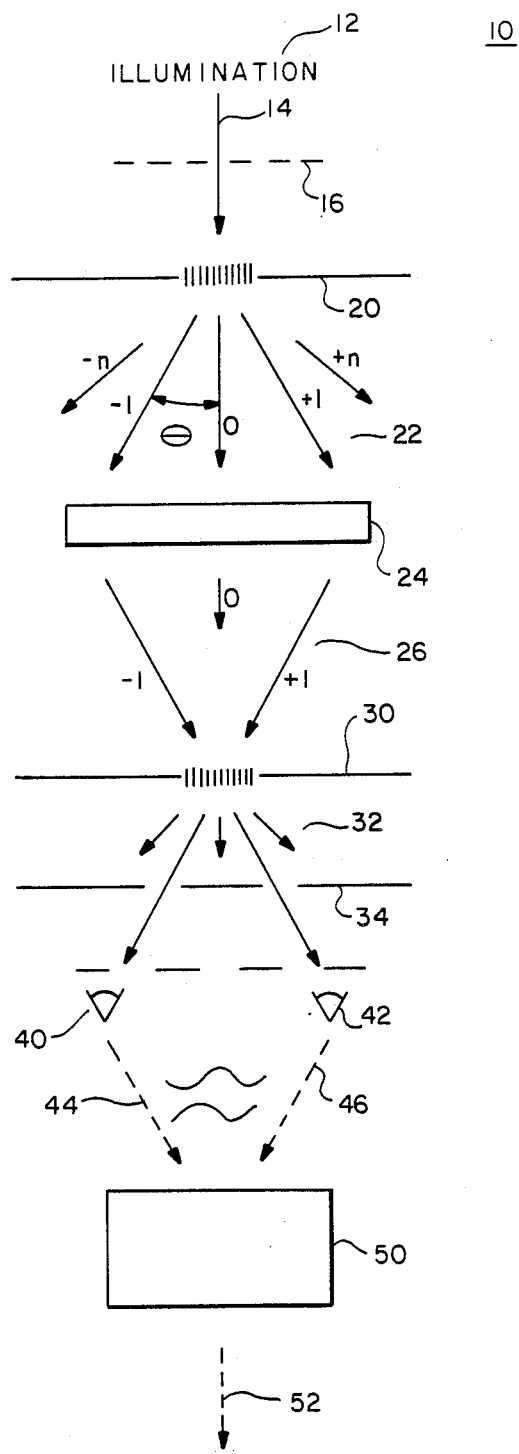
FIG. 1 depicts a schematic diagram of an optical focus sensor system according to the present invention.

Referring now to FIG. 1, a schematic diagram of an optical focus sensor system according to the present invention is depicted. It is believed that a general description of the operation of the present invention will give a better appreciation of the aspects of an optical focus sensor system such as depicted in FIG. 1.

In FIG. 1, a source of illumination 12 provides a light beam 14 which passes through an optical bandpass filter 16 to a first grating 20. The grating 20 is at a reticle plane and might have a 2 $\mu$m pitch, 50% clear to opaque ratio and a 0.75 mm, square aperture. Such a grating 20 is commercially available.

The first grating 20 diffracts the light beam 14 into a plurality of diffracted light beams 22 where each of the diffracted light beams has a respective interference order such as 0, ±1, ..., ±n. The angle $\theta$ between the respective interference orders 22 in FIG. 1 can be determined by the relationship arcsin $\theta = n\lambda$/pitch.

The diffracted light beams 22 in FIG. 1 are imaged from a suitable projection optics 24 to a second, movable grating 30. Grating 30 desirably has the same pitch and clear to opaque ratio as grating 20 and covers a 2 mm square area, and is also commercially available. The grating spacing is chosen so that the projection optics 24 passes only the ±1 interference orders of the diffracted beam 24. The interference orders 0 and ±1 indicated by numeral 26, are diffracted by a second movable grating 30, which is moved laterally in the plane of the object (such as a wafer). The ±1 orders (but not the zero order) are directed to dual photo detectors 40, 42. Ideally this is done by forming an image of the projection system pupil and placing the dual detectors behind a mask 34 which isolates the ±1 orders. Moving grating 30 modulates the light striking the dual photo detectors 40,42 and generates first and second control signals 44,46 (which are two sine waves). The phase difference between the control signals 44,46 is proportional to the focus offset between the planes occupied by the two gratings (i.e., the present invention provides an indication of the magnitude and direction of the focus offset). The control signals 44,46 are input to electronic phase to voltage converter 50.

The purpose of control circuit 50 is to provide a proportional optical focus adjustment signal 52 which can be input to a suitable control circuit (not shown in FIG. 1) to provide a controllable focusing capability according to the present invention.

Figure 2:
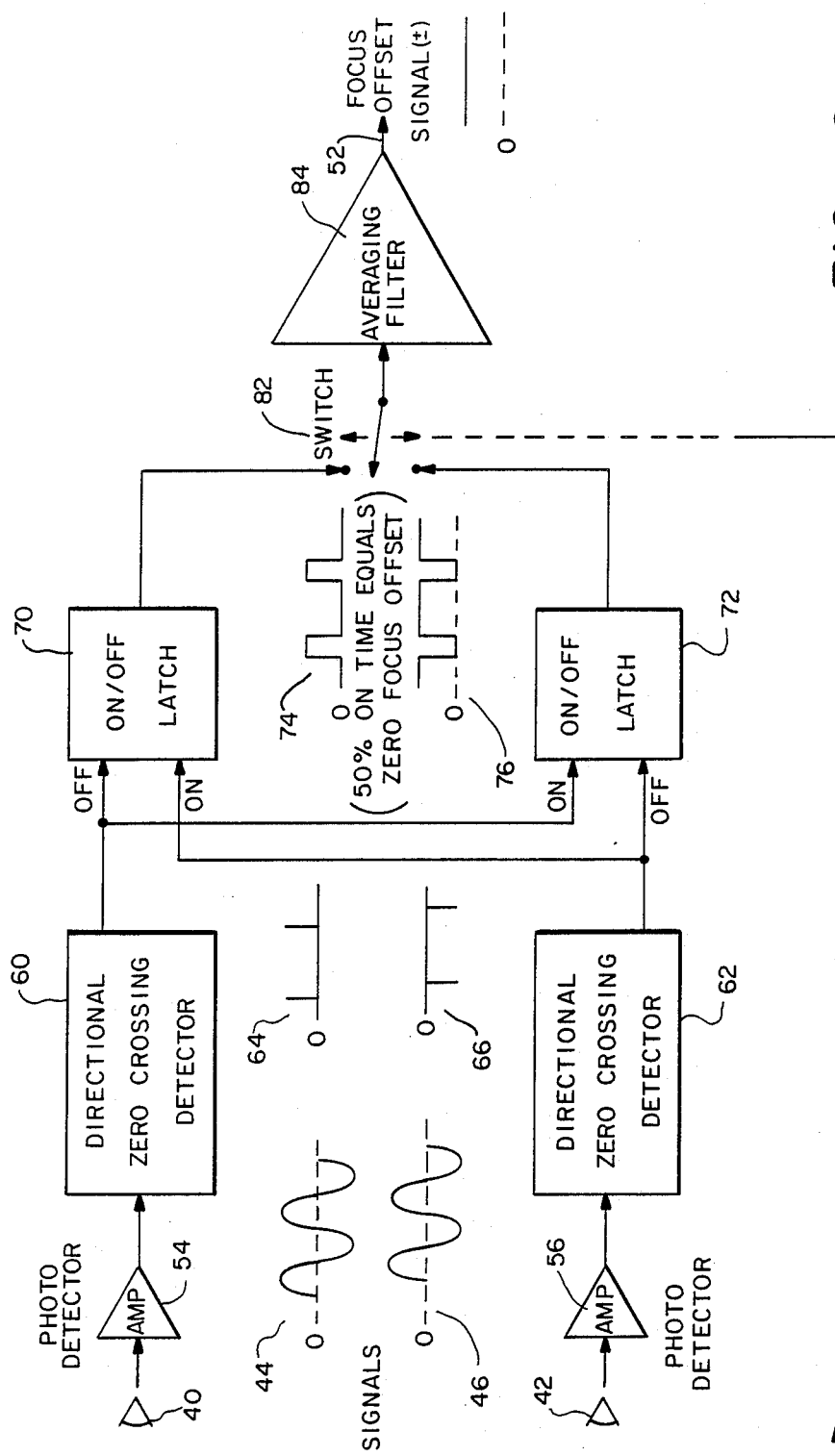
FIG. 2 depicts a block diagram of optical focus signal phase demodulation flow diagram, according to the present invention.

Referring now to FIG. 2, the operation of the control circuit 50 of FIG. 1 will now be described.

In operation, the input from photo detector 40 of FIG. 1 is input through a suitable amplifier 54 to directional zero crossing detector 60. The operation of detector 60 generates a signal 64 corresponding to the zero crossing points of sine wave 44. The output of detector 60 is input to on/off latches 70,72 to provide off and on signals, respectively.

Similarly, the output of photo detector 42 of FIG. 1 is input through an amplifier 56 to directional zero crossing detector 62 which provides zero crossing signals 66 which correspond to the zero crossing points of sine wave 46.

The output of detector 62 is a corresponding input to latch 70 (on signal) and latch 72 (off signal).

Latches 70,72 provide control signals 74,76 respectively, to switch 82, which is connected to an averaging filter 84 to generate the optical focus offset signal 52.

Figure 3:
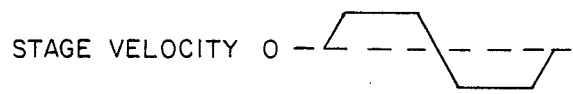
FIG. 3 depicts a diagram depicting stage velocity for a movable grating.

The operation of the control electronics depicted in FIG. 2 are to be taken in conjunction with the movement of a stage velocity which includes the second grating 30 of FIG. 1. The stage velocity movement is depicted by the timing diagram in FIG. 3.

Figure 4:
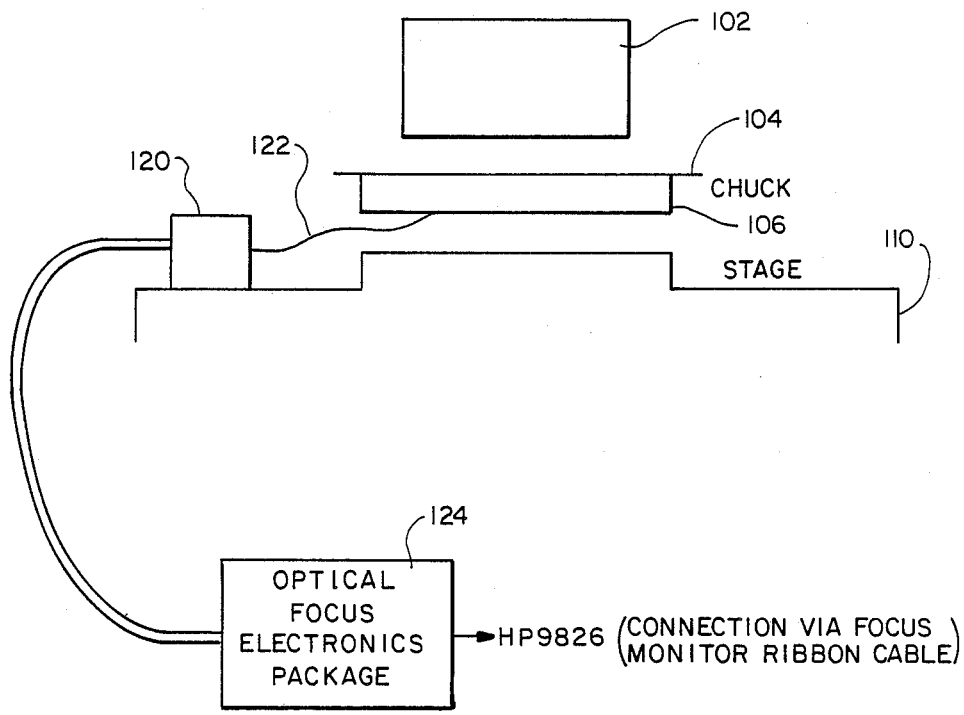
FIG. 4 depicts a system block diagram which incorporates the aspects of the present invention.

Referring now to FIG. 4, a block diagram of a suitable system implementation incorporating the aspects of the present invention is depicted.

In FIG. 4, a system which incorporates the aspects of the present invention include a reticle with a first grating pattern 101 which is imaged by a projection system 102 onto a glass wafer 104 which is suitably mounted on a chuck 106. The chuck 106 is carried by a suitable, moveable stage 110 which also carries an assembly 120 which includes the photo detectors of FIG. 1.

The present invention can utilize fiber optic techniques, such as a fiber optic 122, which conveys the $\pm 1$ orders diffracted by the glass wafer grating to the photo detectors 120.

The output of the photo detectors 120 can be input to a suitable electronics package 124, which incorporates the control electronics of the present invention.

The control circuit 124 provides the proportional optical focus offset signal which can be used to periodically adjust the focus position determined by the air gauge 100, as described in U.S. Pat. Nos. 4,391,494 and 4,425,037.

The theory of operation of the present invention is that a grating is utilized to generate diffracted light beams which are imaged onto a second grating at, for example, a wafer plane. Beneath the wafer grating, two photo detectors sense the sine intensity variation representative of the diffraction from both gratings which result from moving one grating with respect to the other in the direction of the grating periodicity. The detectors are located so that they collect light corresponding to the zero order from the first grating and either the + or — first orders from the second grating. This also includes the + and — orders from the first gratings which are not diffracted by the second grating (zero order). The focus offset is encoded in the relative phase of the two signals. Decoding the phase produces a bi-polar analog signal proportional to the focus offset. The capture range is set by the fact that beyond a $\pm 180°$ phase shift, the decoded signal becomes ambiguous.

The present invention utilizes, in a preferred embodiment, first and second gratings of equal period in both object and image space to obtain very high modulation levels of known period at the photo detectors. This in contrast with prior art approaches which depend upon the object having some spatial frequency components equal to that of the grating in the image plane, but the amplitude of the components being largely unknown.

The location of the photo detectors in the pupil plane can be used to specifically select the diffraction orders used to measure focus error. It has been found to be advantageous to eliminate zero order light from the first grating which passes through the second grating undiffracted (0 order) and high order diffracted ($\pm 2$ and higher) energies of the incident zero order light so as to obtain a predictable, linear relationship between the phase shift and focus error.

The phase measuring electronics, according to the present invention, are independent of the signal amplitude and can accommodate wide variations in the relative velocity between object and image gratings. The control electronics yield a signal which not only indicates the direction of best focus, but also a signal amplitude that is a reliable measure of the amount of focus shift. Thus, the present invention can be used to accurately monitor focus shift, even in situations where good focus is not obtained. For example, in the design of lithographic equipment, it may be desirable to monitor focus in the visible region and expose in the near UV region. Since the visible focus is usually a few microns different from the UV focus, a focus monitoring system would have to operate substantially out of focus.

The present invention provides a capability of determining how far away the proper focal plane is located. This capability is provided by giving an accurate indication of both direction and magnitude of the proper focal plane. As a result, the generation of a focus offset signal according to the present invention provides an improved focus control capability.

Therefore, the foregoing description of a preferred embodiment of the invention has been presented for purposes of illustration and description. It is not intended to be exhaustive or to limit the invention to the precise form disclosed, and obviously many modifications and variations are possible in light of the above teaching. The present embodiment was chosen and described in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

What is claimed is:

1. An optical focusing system comprising
object grating means located in the focal plane of an object for diffracting a light beam into a plurality of diffracted light beams where each of said diffracted light beams has a respective interference order,
image grating means,
projection optic means for focusing said diffracted beams having said respective interference orders to said image grating means,
said object or image grating means being laterally movable with respect to one another in the plane of the grating means, said object and image grating means sized so that the period of one is the same as the other as seen through said system such that the period is large enough so that the +1, zero and —1 orders are transmitted by the system,
detector means for producing varying first and second control signals corresponding respectively to interference between +1 and —1 orders from said object grating means and corresponding orders from said image grating means generated by the zero object order incident on said image grating means where the phase difference between said varying first and second control signals is proportional to the focus offset between said grating means, control means responsive to said first and second control signals for generating a focus offset signal representative of the direction and amount of focus offset of said object, thereby providing a focus control capability.

2. An optical focusing system comprising image grating means, object grating means for diffracting an object light beam into a plurality of diffracted light beams to said image grating means where each of said diffracted light beams has a respective interference order, said image grating means being laterally movable with respect to said object grating means in order to generate modulated signals in said detector means, detector means for detecting varying first and second control signals corresponding to said +1 and −1 orders from said object grating means of interference, said varying first and second control signals having a phase difference proportional to the focus offset between said grating means, and control means responsive to said first and second control signals for generating a focus offset signal representative of the direction and amount of focus offset, thereby providing a focus control capability.

3. An optical focusing system comprising first object grating means for diffracting a light beam into a plurality of diffracted light beams where each of said diffracted light beams has a respective interference order, second image grating means, projection optic means for focusing said diffracted beams having said respective interference orders to said second grating means, said second grating means being laterally movable with respect to said first grating means in order to modulate the light intensity produced by interference between the ± first orders from the object and image grating means which is detected by a minimum of two independent detectors, detector means for producing varying first and second control signals corresponding to said +1 and −1 orders from said object grating means of interference, said varying first and second control signals having a phase difference proportional to the focus offset between said first and second grating means, and control means responsive to said first and second control signals for generating a focus offset signal representative of the direction and amount of focus offset, thereby providing a focus control capability.

4. In an optical focusing system having a first object grating and a second image grating, the method comprising the steps of diffracting a light beam from said first object grating into a plurality of diffracted light beams where each of said diffracted light beams has a respective interference order, focusing said diffracted beams having said respective interference orders to said second grating, laterally moving said second grating with respect to the plane of said object grating in order to modulate the detected signals, producing varying first and second control signals corresponding to said +1 and −1 orders of interference from said object grating where the phase difference between said varying first and second control signals is proportional to the focus offset between said first and second gratings, and generating a focus offset signal representative of the direction and amount of focus offset of said object, thereby providing a focus control capability.

* * * * *